United States Patent [19]

Istomin et al.

[11] 4,082,937
[45] Apr. 4, 1978

[54] CATHODE ASSEMBLY OF ELECTRON BEAM WELDING GUN

[76] Inventors: Evgeny Ivanovich Istomin, ulitsa Oktyabrskoi revoljutsii, 22/7, kv. 20; Alexandr Fedorovich Ivanenko, ulitsa Zodchikh, 62, kv. 339; Leonid Pavlovich Strekal, ulitsa Gorkogo, 138, kv. 8; Adolf Alfonsovich Vasiliev, ulitsa Erevanskaya, 8a, kv. 36; Boris Denisovich Vaskin, Andreevsky spusk, 2, kv. 26, all of Kiev, U.S.S.R.

[21] Appl. No.: 795,503

[22] Filed: May 10, 1977

[51] Int. Cl.² .............................................. B23K 9/00
[52] U.S. Cl. .............................. 219/121 EB; 313/337
[58] Field of Search ............... 313/236, 237, 337, 346; 219/121 EB, 121 EM

[56] References Cited

U.S. PATENT DOCUMENTS

| 3,304,459 | 2/1967 | Shaw | 313/337 |
| 3,440,475 | 4/1969 | Schiller et al. | 313/346 R |

*Primary Examiner*—J. V. Truhe
*Assistant Examiner*—Fred E. Bell
*Attorney, Agent, or Firm*—Fleit & Jacobson

[57] ABSTRACT

Disclosure is made of a cathode assembly of an electron beam welding gun, comprising a current lead, wherein there is arranged a heating cathode which is coaxial with said current lead. Next to said heating cathode and coaxially with it, in a holder's sleeve there is arranged a disc cathode. The holder's sleeve is provided with a central orifice in its bottom to receive the disc cathode. On the internal surface of said sleeve, on the side opposite to the bottom, there is provided a cone-shaped recess widening towards the disc cathode, which recess receives a split ring of a refractory material, intended to press said disc cathode against the bottom of the holder's sleeve.

1 Claim, 3 Drawing Figures

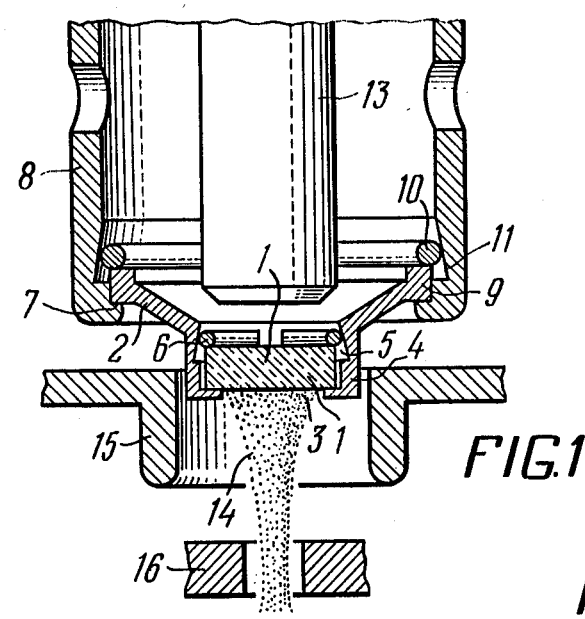
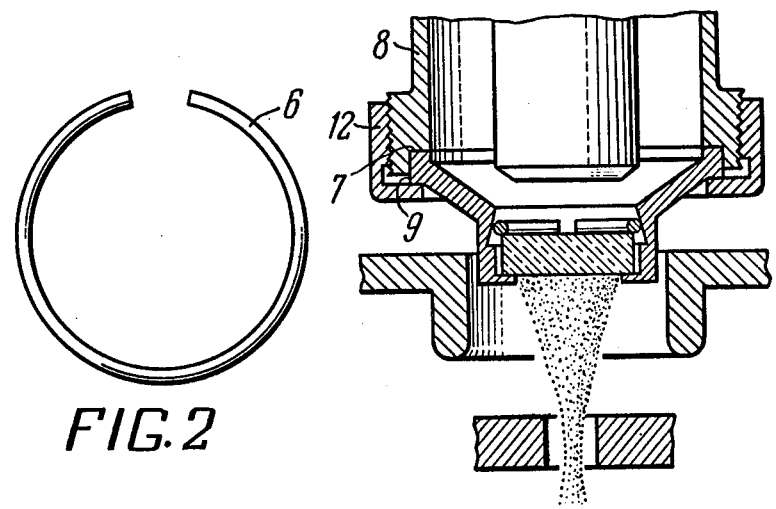

CATHODE ASSEMBLY OF ELECTRON BEAM WELDING GUN

The present invention relates to electron beam welding guns and, more particularly, to a cathode assembly of an electron beam welding gun, heated by means of electron bombardment. The invention is applicable to different fields of electron beam technology.

At present, cathode assemblies of electron beam welding guns commonly incorporate thermionic cathodes, for example, cathodes heated by electron bombardment with the aid of straight-channel heaters.

Thermionic cathodes of high-power electron beam welding guns, including electron bombardment-heated cathodes, are subjected to the effects of vaporization of the material being welded, which is accompanied by ion bombardment. Such severe operating conditions account for short service life of cathodes. It is absolutely necessary that during the operational life of a cathode, the changes in the geometrical parameters of the electron-optical system and the emission characteristics of the cathode should be kept within the limits set for specific applications. Therefore, it would be wise to provide dismountable cathode assemblies for electron beam welding guns, which would make it possible to rapidly replace the cathode and reproduce the original geometrical parameters of the electron-optical system.

It should also be borne in mind that electron beam welding guns intended for job-lot production are normally not provided with spare parts, such as cathodes; on the other hand, a faster replacement of a cathode would cut down the idle time of an electron beam welding gun.

The present-day trend in designing electron beam welding guns is to raise their capacity in an attempt to solve a number of problems, such as increased thicknesses of materials to be welded, increased welding rates, etc.

There are two basic approaches to the designing of electron beam welding guns:
1. Provision of high-power electron beam welding guns operating at high accelerating voltages (of 150 and even upwards of 200 kV) and moderate electron beam current values.
2. Provision of high-power electron beam welding guns operating at high electron beam current values (of more than 1 ampere) and low or moderate accelerating voltages (of 25 to 50 kV).

The first approach involves serious problems in what concerns electron beam welding guns intended for industrial applications. Such electron beam welding guns must be provided with a reliable biological shielding to protect personnel from X-radiation.

The second approach makes it easier to provide for biological protection of personnel from X-radiation. For this reason, a greater part of high-power electron beam welding guns currently used in industry is intended for operation at low or moderate accelerating voltages. However, designers of cathode assemblies of high-power electron beam welding guns are facing a number of problems in their effort to provide effective and economical cathode assemblies which would ensure stable and reliable operation and reproducibility of the operating parameters.

Today, cathode assemblies of electron beam welding guns increasingly make use of hot cathodes, although there are still some types of cathode assemboies incorporating straight-channel cathodes.

For example, there is known a cathode assembly of an electron beam welding gun, which incorporates a straight-channel tantalum cathode manufactured by stamping. The heating of such a cathode requires high power consumption; on the other hand, it is difficult to remove heat under vacuum. This type of cathode assembly cannot be regarded as promising in view of the above limitations, and keeping in mind the continuing tendency to raise the capacity of electron beam welding guns.

There is also known a cathode assembly of an electron beam welding gun with an electron bombardment-heated metal cathode. The cathode is shaped as a washer and provided with an annular groove to be secured in a holder.

The cathode under review requires much heating power due to intense transfer of heat from the cathode body to the holder. With the emitting surface having a diameter of about 5 mm, the required heating power amounts to about 1,400 w. Besides, the way in which the cathode is secured in the holder does not rule out changes in the spatial positioning of the emitting surface in the course of operation, which effects the electron-optical system.

There is further known a cathode assembly of an electron beam welding gun, which comprises a stepped rod-type metal cathode. The latter is heated by electron bombardment with the aid of a coil encompassing that portion of the rod which is next to the emitting surface.

The latter type of cathode assembly also has a number of disadvantages which include the following:
- the electron beam current is limited (the existing cathodes of this type operate at a current of not more than 400 mA) due to a small diameter of the emitting surface, which is about 3 mm;
- the neck of the stepped rod-type metal cathode is made narrow to reduce the heat removal; yet this may be the cause of cathode deformations in the case of non-uniform heating of the cathode by electron bombardment, which is generally known to take place.

Finally, there is known a cathode assembly of an electron beam welding gun, wherein the cathode is a disc of tantalum with a spherical concave emitting surface. The cathode is pressed into a thin-walled sleeve with a spherical convex bottom facing the anode and heated by electron bombardment.

The cathode assembly of the latter type has the following disadvantages. The cathode (the emitter) is shaped as a disc or pellet whose diameter is normally two to three times greater than its thickness. The fact that the cathode is secured in a holder, which is a thin-walled sleeve of a refractory material, does not guarantee that the original geometrical parameters of the electron-optical system of the welding gun will remain intact, due to unavoidable deformations of the cathode which is repeatedly heated to a high temperature and then cooled; as a result, it is hard to reproduce the original geometrical parameters of the electron-optical system after a cathode replacement. Besides, the cathode and the electron beam welding gun as a whole are not economical enough because of the relatively intense transfer of heat from the cathode to the cathode holder, which, in turn is due to the fact that the cathode is pressed into the holder.

Finally, the cathode holder has to be replaced with the cathode. This is due to the fact that the tin-walled sleeve of a refractory material is deformed following repeated high-temperature heating and cooling of the cathode, which effects the size of the cathode's seat in the holder.

It is an object of the present invention to provide a cathode assembly of an electron beam welding gun, which would ensure repeated utilization of the cathode holder following replacements of cathodes, and raise the stability and reproducibility of the electron-optical system in the course of operation.

It is another object of the invention to improve the effectiveness of the electron bombardment-heated cathode.

The foregoing objects are attained by providing a cathode assembly of an electron beam welding gun, comprising a disc cathode secured in a holder's sleeve, and a heating cathode arranged in a current lead next to the disc cathode, in which cathode assembly the holder's sleeve is provided, according to the invention, with a central orifice in its bottom, whereon there is placed the disc cathode, the internal surface of the holder's sleeve having a cone-shaped recess which widens towards the disc cathode, said recess being intended to receive a split ring of a refractory material for pressing the disc cathode against the bottom of the holder's sleeve.

The proposed cathode assembly of an electron beam welding gun is highly economical because it reduces the transfer of heat from the disc cathode to the cathode holder. This is due to the fact that there is some clearance between the disc cathode and the cathode holder and a small area of contact between the disc cathode and the bottom of the holder; another reason is the fact that the disc cathode is only slightly pressed against the bottom of the holder by the split ring, although the pressure is sufficient to hold the cathode in place irrespective of the spatial positioning of the electron beam welding gun during operation.

The proposed cathode assembly of an electron beam welding gun is of a refractory material. The disc cathode is not rigidly secured to the holder, as is the case with one of the conventional cathode assembly types, wherein the cathode is pressed into the holder. Finally, the cathode assembly itself is of robust construction. All these factors assure repeated utilization of the cathode holder without affecting the stability of the geometrical parameters of the electron-optical system.

The simplicity of the holder and the split ring of the proposed cathode assembly account for low manufacturing costs of these items, as well as a simple replacement of a disabled cathode.

Other objects and advantages of the present invention will be more readily understood from the following detailed description of a preferred embodiment thereof to be read in conjunction with the accompanying drawings, wherein:

FIG. 1 is a section of a cathode assembly of an electron beam welding gun, in accordance with the invention;

FIG. 2 is a view of a split ring arranged in a holder's sleeve;

FIG. 3 shows the arrangement of a holder in a current lead.

Referring to the attached drawings, the proposed cathode assembly of an electron beam welding gun comprises a disc cathode 1 (FIG. 2) of lanthanum hexaboride (LaB$_6$) of tantalum. The disc cathode 1 is arranged in a sleeve of a holder 2 so that there is some clearance therebetween. The sleeve of the holder 2 is of a refractory material with a low emissivity, for example, molybdenum. The sleeve of the holder 2 has a central orifice 3 proviced in its bottom 4. The size of the orifice 3 determines the size of the emitting surface of the disc cathode 1. In order to provide for different electron beam current ranges, the cathode assembly of this invention has two or three holders 2 with different diameters of the central orifice 3. On the internal surface of the sleeve of the holder 2 there is provided a cone-shaped recess 5 which widens towards the disc cathode 1 and is intended to receive a split ring 6 (FIGS. 1 and 2) of a refractory material, for example, tungsten or molybdenum. The split ring 6 exerts a uniformly distributed pressure on the disc cathode 1 to press the latter against the bottom 4 (FIG. 1) of the sleeve of the holder 2.

The holder 2 is designed so that the plane, in which said holder 2 adjoins a seat 7 (FIG. 1) in a current lead 8 of the cathode, is parallel with the plane of the bottom 4 of the sleeve of the holder 2, whereto there is pressed the disc cathode 1. A shoulder 9 of the holder 2, which serves for centering the holder 2 in the seat 7 of the cathode's current lead 8, is coaxial with the axis of the central orifice 3 provided in the bottom 4 of the holder's sleeve. The mutual positioning of these components does not change in the course of operation, which accounts for constant geometrical parameters of the electron-optical system of the cathode assembly both during operation and in case of a replacement of the disabled disc cathode 1.

The holder 2 is arranged in the cathode current lead 8. The latter is of stainless steel. The holder 2 is pressed against the seat 7 of the cathode current lead 8 by a split ring 10 of a refractory material, for example, tungsten or molybdenum. The ring 10 is received in an internal cone-shaped recess 11 provided in the cathode current lead 8.

The split rings 6 and 10 ensure reliable operation of the proposed cathode assembly irrespective of spatial positioning of the electron beam welding gun. In the course of operation, the material of the split rings 6 and 10 becomes brittle as a result of heating, wherefore a replacement of the disc cathode 1 necessitates a replacement of said split rings 6 and 10.

The shape of the split rings 6 and 10 is quite simple, which accounts for the simplicity of their manufacture and replacement.

The holder 2 may be arranged in the current lead 8 in a different manner (FIG. 3). As is seen from FIG. 3, the holder 2 is placed on the seat 7 of the current lead 8 with the aid of a union nut 12 made, for example, of stainless steel. Some graphite is rubbed into the threads of the union nut 12 and current lead 8 to avoid caking.

Consider now operation of the proposed cathode assembly of an electron beam welding gun (FIG. 1).

The disc cathode 1 is heated with the aid of a heating cathode 13. The cathode 1 emits an electron beam 14 which is shaped by the central orifice 3 provided in the bottom 4 of the holder 2, and focused with the aid of an electrode 15 and an anode 16.

What is claimed is:

1. A cathode assembly of an electron beam welding gun, comprising: a current lead; a holder having a sleeve secured in said current lead; a disc cathode secured in said holder's sleeve; a heating cathode arranged in said current lead, coaxially therewith; said sleeve of said holder having a central orifice in its bottom, whereon there is placed said disc cathode; a cone-shaped recess provided on the internal surface of said sleeve, on the side opposite to the disc cathode, said recess widening towards said disc cathode; a split ring of a refractory material, received in said cone-shaped recess and pressing said disc cathode to said bottom of said holder's sleeve.

* * * * *